(12) United States Patent
Nemani et al.

(10) Patent No.: US 7,943,531 B2
(45) Date of Patent: May 17, 2011

(54) METHODS FOR FORMING A SILICON OXIDE LAYER OVER A SUBSTRATE

(75) Inventors: Srinivas D. Nemani, Sunnyvale, CA (US); Abhijit Basu Mallick, Palo Alto, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/876,664

(22) Filed: Oct. 22, 2007

(65) Prior Publication Data

US 2009/0104791 A1  Apr. 23, 2009

(51) Int. Cl.
*H01L 21/469* (2006.01)

(52) U.S. Cl. ........ 438/787; 438/788; 438/789; 438/790; 257/E21.277; 257/E21.278

(58) Field of Classification Search .......... 438/787–790; 257/E21.277–E21.278
See application file for complete search history.

(56) References Cited

U.S. PATENT DOCUMENTS

| | | |
|---|---|---|
| 4,147,571 A | 4/1979 | Stringfellow et al. |
| 4,816,098 A | 3/1989 | Davis et al. |
| 4,818,326 A | 4/1989 | Liu et al. |
| 4,931,354 A | 6/1990 | Wakino et al. |
| 5,016,332 A | 5/1991 | Reichelderfer et al. |
| 5,110,407 A | 5/1992 | Ono et al. |
| 5,393,708 A | 2/1995 | Hsia et al. |
| 5,426,076 A | 6/1995 | Moghadam |
| 5,558,717 A | 9/1996 | Zhao et al. |
| 5,587,014 A | 12/1996 | Lyechika et al. |
| 5,622,784 A | 4/1997 | Okaue et al. |
| 5,635,409 A | 6/1997 | Moslehi |
| 5,691,009 A | 11/1997 | Sandhu |
| 5,786,263 A | 7/1998 | Perera |
| 5,853,607 A | 12/1998 | Zhao et al. |

(Continued)

FOREIGN PATENT DOCUMENTS

DE 19654737 A1 7/1997

(Continued)

OTHER PUBLICATIONS

Coltrin, M.E., et al., "Chemistry of AlGaN Particulate Formation," National Nuclear Security Administration, Physical, Chemical, & Nano Sciences Center, Research Briefs, 2005, pp. 42-43.

(Continued)

*Primary Examiner* — Hsien-ming Lee
*Assistant Examiner* — Kevin Parendo
(74) *Attorney, Agent, or Firm* — Kilpatrick Townsend and Stockton

(57) ABSTRACT

A method of depositing a silicon oxide layer over a substrate includes providing a substrate to a deposition chamber. A first silicon-containing precursor, a second silicon-containing precursor and a $NH_3$ plasma are reacted to form a silicon oxide layer. The first silicon-containing precursor includes at least one of Si—H bond and Si—Si bond. The second silicon-containing precursor includes at least one Si—N bond. The deposited silicon oxide layer is annealed.

26 Claims, 8 Drawing Sheets

U.S. PATENT DOCUMENTS

| | | | |
|---|---|---|---|
| 5,937,308 A | 8/1999 | Gardner et al. | |
| 5,937,323 A | 8/1999 | Orczyk et al. | |
| 6,008,515 A | 12/1999 | Hsia et al. | |
| 6,009,830 A | 1/2000 | Li et al. | |
| 6,024,044 A | 2/2000 | Law et al. | |
| 6,087,243 A | 7/2000 | Wang | |
| 6,090,723 A | 7/2000 | Thakur et al. | |
| 6,140,242 A | 10/2000 | Oh et al. | |
| 6,146,970 A | 11/2000 | Witek et al. | |
| 6,156,581 A | 12/2000 | Vaudo et al. | |
| 6,165,834 A | 12/2000 | Agarwal et al. | |
| 6,180,490 B1 | 1/2001 | Vassiliev et al. | |
| 6,207,587 B1 | 3/2001 | Li et al. | |
| 6,302,964 B1 | 10/2001 | Umotoy et al. | |
| 6,383,954 B1 | 5/2002 | Wang et al. | |
| 6,387,207 B1 | 5/2002 | Janakiraman et al. | |
| 6,406,677 B1 | 6/2002 | Carter et al. | |
| 6,448,187 B2* | 9/2002 | Yau et al. | 438/758 |
| 6,503,557 B1 | 1/2003 | Joret | |
| 6,506,253 B2 | 1/2003 | Sakuma | |
| 6,508,879 B1 | 1/2003 | Hashimoto | |
| 6,509,283 B1 | 1/2003 | Thomas | |
| 6,524,931 B1 | 2/2003 | Perera | |
| 6,528,332 B2 | 3/2003 | Mahanpour et al. | |
| 6,544,900 B2 | 4/2003 | Raaijmakers et al. | |
| 6,548,416 B2 | 4/2003 | Han et al. | |
| 6,548,899 B2 | 4/2003 | Ross | |
| 6,559,026 B1 | 5/2003 | Rossman et al. | |
| 6,566,278 B1 | 5/2003 | Harvey et al. | |
| 6,596,654 B1 | 7/2003 | Bayman et al. | |
| 6,614,181 B1 | 9/2003 | Harvey et al. | |
| 6,630,413 B2 | 10/2003 | Todd | |
| 6,660,391 B1 | 12/2003 | Rose et al. | |
| 6,676,751 B2 | 1/2004 | Solomon et al. | |
| 6,683,364 B2 | 1/2004 | Oh et al. | |
| 6,716,770 B2* | 4/2004 | O'Neill et al. | 438/780 |
| 6,756,085 B2 | 6/2004 | Waldfried et al. | |
| 6,787,191 B2 | 9/2004 | Hanahata et al. | |
| 6,794,290 B1 | 9/2004 | Papasouliotis et al. | |
| 6,818,517 B1 | 11/2004 | Maes | |
| 6,830,624 B2 | 12/2004 | Janakiraman et al. | |
| 6,833,052 B2 | 12/2004 | Li et al. | |
| 6,833,322 B2* | 12/2004 | Anderson et al. | 438/680 |
| 6,867,086 B1 | 3/2005 | Chen et al. | |
| 6,890,403 B2 | 5/2005 | Cheung | |
| 6,900,067 B2 | 5/2005 | Kobayashi et al. | |
| 6,955,836 B2 | 10/2005 | Kumagi et al. | |
| 6,958,112 B2 | 10/2005 | Karim et al. | |
| 7,018,902 B2 | 3/2006 | Visoday et al. | |
| 7,084,076 B2 | 8/2006 | Park et al. | |
| 7,115,419 B2* | 10/2006 | Suzuki | 435/402 |
| 7,129,185 B2 | 10/2006 | Aoyama et al. | |
| 7,148,155 B1 | 12/2006 | Tarafdar et al. | |
| 7,205,248 B2 | 4/2007 | Li et al. | |
| 7,220,461 B2 | 5/2007 | Hasebe et al. | |
| 7,297,608 B1 | 11/2007 | Papasouliotis et al. | |
| 7,335,609 B2 | 2/2008 | Ingle et al. | |
| 7,399,388 B2 | 7/2008 | Moghadam et al. | |
| 7,419,903 B2* | 9/2008 | Haukka et al. | 438/627 |
| 7,435,661 B2 | 10/2008 | Miller et al. | |
| 7,456,116 B2 | 11/2008 | Ingle et al. | |
| 7,498,273 B2 | 3/2009 | Mallick et al. | |
| 7,524,735 B1 | 4/2009 | Gauri et al. | |
| 7,541,297 B2 | 6/2009 | Mallick et al. | |
| 7,745,352 B2 | 6/2010 | Mallick et al. | |
| 7,790,634 B2 | 9/2010 | Munro et al. | |
| 7,803,722 B2 | 9/2010 | Liang | |
| 7,825,038 B2 | 11/2010 | Ingle et al. | |
| 7,825,044 B2 | 11/2010 | Mallick et al. | |
| 7,867,923 B2 | 1/2011 | Mallick et al. | |
| 2001/0021595 A1 | 9/2001 | Jang et al. | |
| 2001/0029114 A1 | 10/2001 | Vulpio et al. | |
| 2001/0038919 A1 | 11/2001 | Berry et al. | |
| 2001/0054387 A1 | 12/2001 | Frankel et al. | |
| 2002/0048969 A1 | 4/2002 | Suzuki et al. | |
| 2002/0081817 A1 | 6/2002 | Bhakta et al. | |
| 2002/0127350 A1 | 9/2002 | Ishikawa et al. | |
| 2002/0142585 A1 | 10/2002 | Mandal | |
| 2002/0146879 A1 | 10/2002 | Fu et al. | |
| 2002/0164891 A1 | 11/2002 | Gates et al. | |
| 2003/0064154 A1 | 4/2003 | Laxman et al. | |
| 2003/0118748 A1* | 6/2003 | Kumagai et al. | 427/578 |
| 2003/0124873 A1 | 7/2003 | Xing et al. | |
| 2003/0143841 A1 | 7/2003 | Yang et al. | |
| 2003/0159656 A1 | 8/2003 | Tan et al. | |
| 2003/0172872 A1 | 9/2003 | Thakus et al. | |
| 2003/0199151 A1 | 10/2003 | Ho et al. | |
| 2003/0232495 A1* | 12/2003 | Moghadam et al. | 438/623 |
| 2004/0008334 A1 | 1/2004 | Sreenivasan et al. | |
| 2004/0020601 A1 | 2/2004 | Zhao et al. | |
| 2004/0048492 A1 | 3/2004 | Ishikawa et al. | |
| 2004/0065253 A1 | 4/2004 | Pois et al. | |
| 2004/0079118 A1 | 4/2004 | M'Saad et al. | |
| 2004/0146661 A1 | 7/2004 | Kapoor et al. | |
| 2004/0152342 A1 | 8/2004 | Li et al. | |
| 2004/0161899 A1 | 8/2004 | Luo et al. | |
| 2004/0175501 A1 | 9/2004 | Lukas et al. | |
| 2004/0180557 A1* | 9/2004 | Park et al. | 438/787 |
| 2004/0185641 A1 | 9/2004 | Tanabe et al. | |
| 2004/0219780 A1 | 11/2004 | Ohuchi | |
| 2004/0241342 A1 | 12/2004 | Karim et al. | |
| 2005/0001556 A1 | 1/2005 | Hoffman et al. | |
| 2005/0019494 A1 | 1/2005 | Moghadam et al. | |
| 2005/0026443 A1 | 2/2005 | Goo et al. | |
| 2005/0062165 A1 | 3/2005 | Saenger et al. | |
| 2005/0087140 A1 | 4/2005 | Yuda et al. | |
| 2005/0142895 A1 | 6/2005 | Ingle et al. | |
| 2005/0153574 A1 | 7/2005 | Mandal | |
| 2005/0181555 A1 | 8/2005 | Haukka et al. | |
| 2005/0186731 A1 | 8/2005 | Derderian et al. | |
| 2005/0196533 A1 | 9/2005 | Hasebe et al. | |
| 2005/0227499 A1* | 10/2005 | Park et al. | 438/778 |
| 2005/0250340 A1 | 11/2005 | Chen et al. | |
| 2006/0011984 A1 | 1/2006 | Curie | |
| 2006/0014399 A1* | 1/2006 | Joe | 438/791 |
| 2006/0030165 A1 | 2/2006 | Ingle et al. | |
| 2006/0055004 A1 | 3/2006 | Gates et al. | |
| 2006/0068599 A1 | 3/2006 | Baek et al. | |
| 2006/0096540 A1 | 5/2006 | Choi | |
| 2006/0110943 A1 | 5/2006 | Swerts et al. | |
| 2006/0121394 A1 | 6/2006 | Chi | |
| 2006/0162661 A1 | 7/2006 | Jung et al. | |
| 2006/0178018 A1 | 8/2006 | Olsen | |
| 2006/0223315 A1 | 10/2006 | Yokota et al. | |
| 2006/0228903 A1 | 10/2006 | McSwiney et al. | |
| 2006/0281496 A1 | 12/2006 | Cedraeus | |
| 2006/0286776 A1* | 12/2006 | Ranish et al. | 438/478 |
| 2007/0020392 A1* | 1/2007 | Kobrin et al. | 427/249.1 |
| 2007/0026689 A1 | 2/2007 | Nakata et al. | |
| 2007/0049044 A1 | 3/2007 | Marsh | |
| 2007/0077777 A1 | 4/2007 | Gumpher | |
| 2007/0092661 A1 | 4/2007 | Ryuzaki et al. | |
| 2007/0128864 A1 | 6/2007 | Ma et al. | |
| 2007/0173073 A1* | 7/2007 | Weber | 438/787 |
| 2007/0181966 A1 | 8/2007 | Watatani et al. | |
| 2007/0232071 A1 | 10/2007 | Balseanu et al. | |
| 2007/0232082 A1 | 10/2007 | Balseanu et al. | |
| 2007/0275569 A1 | 11/2007 | Moghadam et al. | |
| 2007/0281495 A1* | 12/2007 | Mallick et al. | 438/778 |
| 2007/0281496 A1 | 12/2007 | Ingle et al. | |
| 2008/0085607 A1 | 4/2008 | Yu et al. | |
| 2008/0102223 A1* | 5/2008 | Wagner et al. | 427/585 |
| 2009/0061647 A1 | 3/2009 | Mallick et al. | |
| 2009/0104755 A1 | 4/2009 | Mallick et al. | |
| 2009/0325391 A1 | 12/2009 | De Vusser et al. | |

FOREIGN PATENT DOCUMENTS

| | | |
|---|---|---|
| EP | 0892083 A1 | 1/1999 |
| EP | 1717848 A | 11/2006 |
| JP | 01241826 A | 9/1989 |
| KR | 10-2004-0091978 A | 11/2004 |
| KR | 10-2005-0003758 A | 1/2005 |
| KR | 10-2005-0094183 A | 9/2005 |
| WO | WO 02/077320 A1 | 10/2002 |
| WO | WO 03/066933 A | 8/2003 |
| WO | WO 2005/078784 A | 8/2005 |

| | | | |
|---|---|---|---|
| WO | WO 2007/040856 A2 | 4/2007 | |
| WO | WO 2007/140376 A | 12/2007 | |
| WO | WO 2007/140424 A | 12/2007 | |

OTHER PUBLICATIONS

Kang, Hun, "A Study of the Nucleation and Formation of Multifunctional Nanostructures using GaN-Based Materials for Device Applications," Georgia Institute of Technology, Doctor of Philosophy in the School of Electrical & Computer Engineering Dissertation, Dec. 2006, p. 14.

International Search Report PCT/US07/71804.

PCT International Search Report and Written Opinion mailed on Jul. 30, 2008 by the European Patent Office, International Application No. PCT/US2007/081139, 19 pages.

Gulleri, G. et al., "Deposition Temperature Determination of HDPCVD Silicon Dioxide Films," 2005, Microelectronic Engineering, vol. 82, pp. 236-241.

PCT International Search Report and Written Opinion mailed Jan. 6, 2009, International Application No. PCT/US08/82365, 12 pages.

PCT International Search Report and Written Opinion mailed Mar. 18, 2009; International Application No. PCT/US08/80518, 10 pages.

EP Search Report mailed Jun. 9, 2009; Application No. 08167338.6, 9 pages.

Tsu, D. V. et al., "Silicon Nitride and Silicon Diimide Grown By Remote Plasma Enhanced Chemical Vapor Deposition", Journal of Vacuum Science and Technology: Part A, AVS/AIP, Melville, NY.; US, vol. 4, No. 3, Part 01, May 1, 1986, pp. 480-485.

Lee, Eun Gu, et al., "Effects of Wet Oxidation on the Electrical Properties of sub-10 nm thick silicon nitride films", Thin Solid Films, Elsevier-Sequoia S.A. Lausanne, CH. vol. 205, No. 2, Dec. 1, 1991, pp. 246-251.

Lucovsky, G. et al., "Deposition of silicon dioxide and silicon nitride by remote plasma enhanced chemical vapor deposition," Journal of Vacuum Science & Technology, vol. 4, No. 3, May-Jun. (1986), pp. 681-688.

PCT International Search Report and Written Opinion mailed Apr. 12, 2010; International Application No. PCT/US2009/055073, 12 pages.

* cited by examiner

METHODS FOR FORMING A SILICON OXIDE LAYER OVER A SUBSTRATE

CROSS-REFERENCES TO RELATED APPLICATIONS

This application is related to co-assigned U.S. Provisional Patent Application No. 60/803,499 to Lubomirsky et al, filed May 30, 2006, and titled "PROCESS CHAMBER FOR DIELECTRIC GAPFILL." This application is related to co-assigned U.S. Pat. No. 6,387,207 to Janakiraman et al., issued May 14, 2002, and titled "INTEGRATION OF REMOTE PLASMA GENERATOR WITH SEMICONDUCTOR PROCESSING CHAMBER." This application is related to and co-assigned U.S. Pat. No. 6,830,624 to Janakiraman et al., issued Dec. 14, 2004, and titled "BLOCKER PLATE BYPASS FOR REMOTE PLASMA CLEAN." This application is also related to co-assigned U.S. Pat. No. 5,558,717 to Zhao et al., and titled "CVD PROCESSING CHAMBER." The entire contents of all related applications is hereby incorporated by reference for all purposes.

BACKGROUND OF THE INVENTION

Semiconductor device geometries have dramatically decreased in size since their introduction several decades ago. Modern semiconductor fabrication equipment routinely produces devices with 250 nm, 180 nm, and 65 nm feature sizes, and new equipment is being developed and implemented to make devices with even smaller geometries. The smaller sizes, however, mean device elements have to work closer together which can increase the chances of electrical interference, including cross-talk and parasitic capacitance.

To reduce the degree of electrical interference, dielectric insulating materials are used to fill the gaps, trenches, and other spaces between the device elements, metal lines, and other device features. The dielectric materials are chosen for their ease of formation in the spaces between device features, and their low dielectric constants (i.e., "k-values"). Dielectrics with lower k-values are better at minimizing cross-talk and RC time delays, as well as reducing the overall power consumption of the device. Conventional dielectric materials include silicon oxide, which has an average k-value between 4.0 and 4.2 when deposited with conventional CVD techniques.

While the k-value of conventional CVD silicon oxide is acceptable for many device structures, the ever decreasing sizes and increasing densities of device elements have kept semiconductor manufacturers looking for dielectric materials with lower k-values. One approach has been to dope the silicon oxide with fluorine to make a fluorine-doped silicon oxide film (i.e., "FSG" film) with a dielectric constant as low as about 3.4 to 3.6. Another has been the development of spin-on glass techniques that coat the substrate with highly flowable precursors like hydrogen silsesquioxane (HSQ) to form a porous low-k film.

More recently, silicon-oxygen-carbon (Si—O—C) films have been developed with k-values of 3.0 or less. These low-k films are often deposited by the chemical vapor deposition of carbon-silicon and oxygen precursors on the substrate. While these Si—O—C films have lower k-values than pure and fluorine-doped silicon oxide films, they also tend to be substantially more porous, which can have negative consequences. Porous films are prone to increased absorption of water, which can increase the k-value of the film. Porous films also have higher "wet etch rate ratios" (WERRs) that can make the film more prone to corrosion and stress cracking.

Thus, there is a need for new methods of depositing low-k carbon based films with reduced porosity, lower WERR values, and less cracking. These and other issues are addressed by embodiments of the invention.

BRIEF SUMMARY OF THE INVENTION

Embodiments of the invention may also include a method for of depositing a silicon oxide layer over a substrate. The method includes providing a substrate to a deposition chamber. A first silicon-containing precursor, a second silicon-containing precursor and a $NH_3$ plasma is reacted to form a silicon oxide layer. The first silicon-containing precursor includes at least one of Si—H bond and Si—Si bond. The second silicon-containing precursor includes at least one Si—N bond. The deposited silicon oxide layer is annealed.

Embodiments of the invention include methods of depositing a silicon oxide layer over a substrate. The methods may include providing a substrate to a deposition chamber. An atomic oxygen precursor may be generated outside the deposition chamber and introduced into the chamber. A silicon precursor may be introduced to the deposition chamber. The silicon precursor may have a C:Si atom ratio of about 8 or less. The silicon precursor and the atomic oxygen precursor may be first mixed in the chamber. The silicon precursor and the atomic oxygen precursor may be reacted to form the silicon oxide layer on the substrate. The deposited silicon oxide layer may be annealed.

Embodiments of the invention may also include methods of depositing a silicon oxide layer over a substrate. The methods may include providing a substrate to a deposition chamber. An atomic oxygen precursor may be generated by plasmaizing an ozone-containing precursor outside the deposition chamber and introduced into the chamber. A silicon precursor may be introduced to the deposition chamber. The silicon precursor may have a C:Si atom ratio of about 8 or less. The silicon precursor and the atomic oxygen precursor may be first mixed in the chamber. The silicon precursor and the atomic oxygen precursor may be reacted at a process pressure between about 100 Torr and about 760 Torr to form the silicon oxide layer on the substrate. The deposited silicon oxide layer may be annealed.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

Systems and methods are described for depositing a silicon oxide layer with desired flowability that is then annealed (i.e., cured) into an oxide layer or fill having a desired quality. The desired flowability of the initially formed oxide allows it to fill aspect ratio gaps and trenches (e.g., aspect ratios greater than 5:1) without gaps or seams. The annealing step then drives out moisture to leave behind a dense oxide film having a wet etch rate ratio (WERR) that may approach the practical limit for silicon oxide films (e.g., WERRs down to about 1.8 to about 1.4).

The exemplary methods may include the remote generation of reactive atomic oxygen outside a deposition/reaction chamber. The atomic oxygen may be first mixed with a silicon precursor having a C:Si atom ratio of about 8 or less in the deposition chamber, where they can react even at low temperatures and pressures and deposit silicon oxide over a substrate. The oxide formed may have a desired level of hydroxyl groups bonded to the silicon, which can make the oxide desirably flowable. Once deposited, the oxide will desirably flow even at low temperatures to fill nascent voids and seams during a gap or trench fill. Then after the deposition, the annealing step may converts an amount of the Si—OH groups into silicon dioxide and water vapor, which is driven out of the deposited film.

Exemplary Oxide Layer Formation Processes

Figure 1:
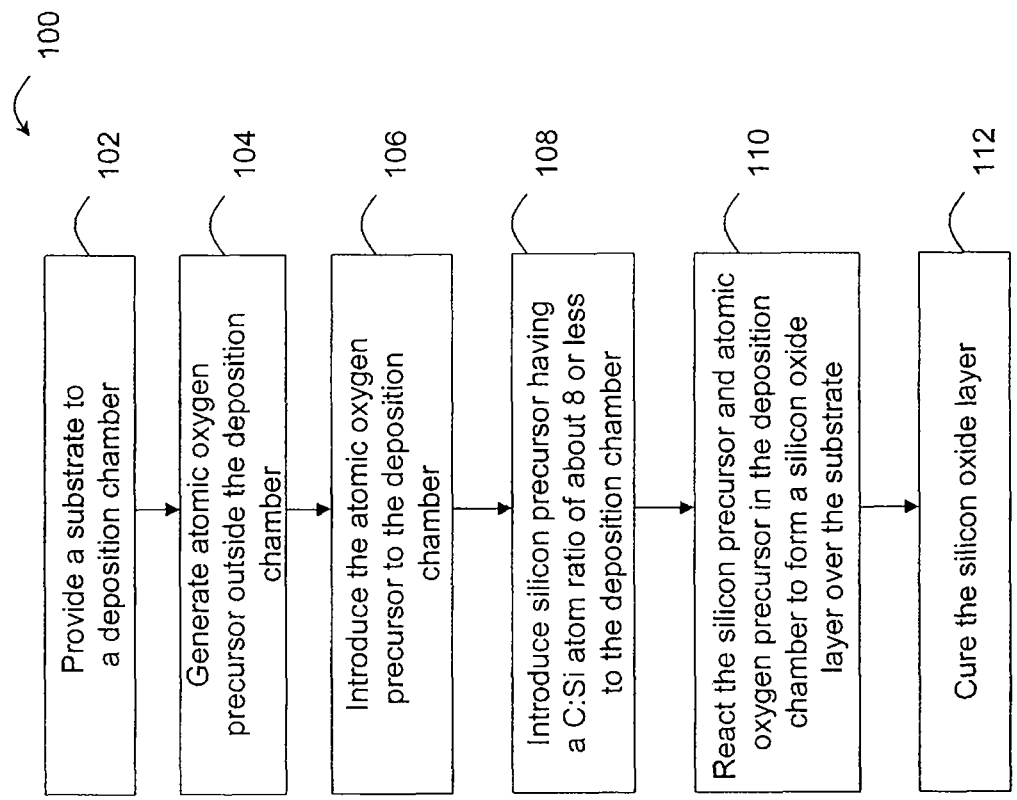
FIG. 1 shows a flowchart that includes steps in an exemplary method 100 of forming an oxide layers over a substrate.
Figure 2A:
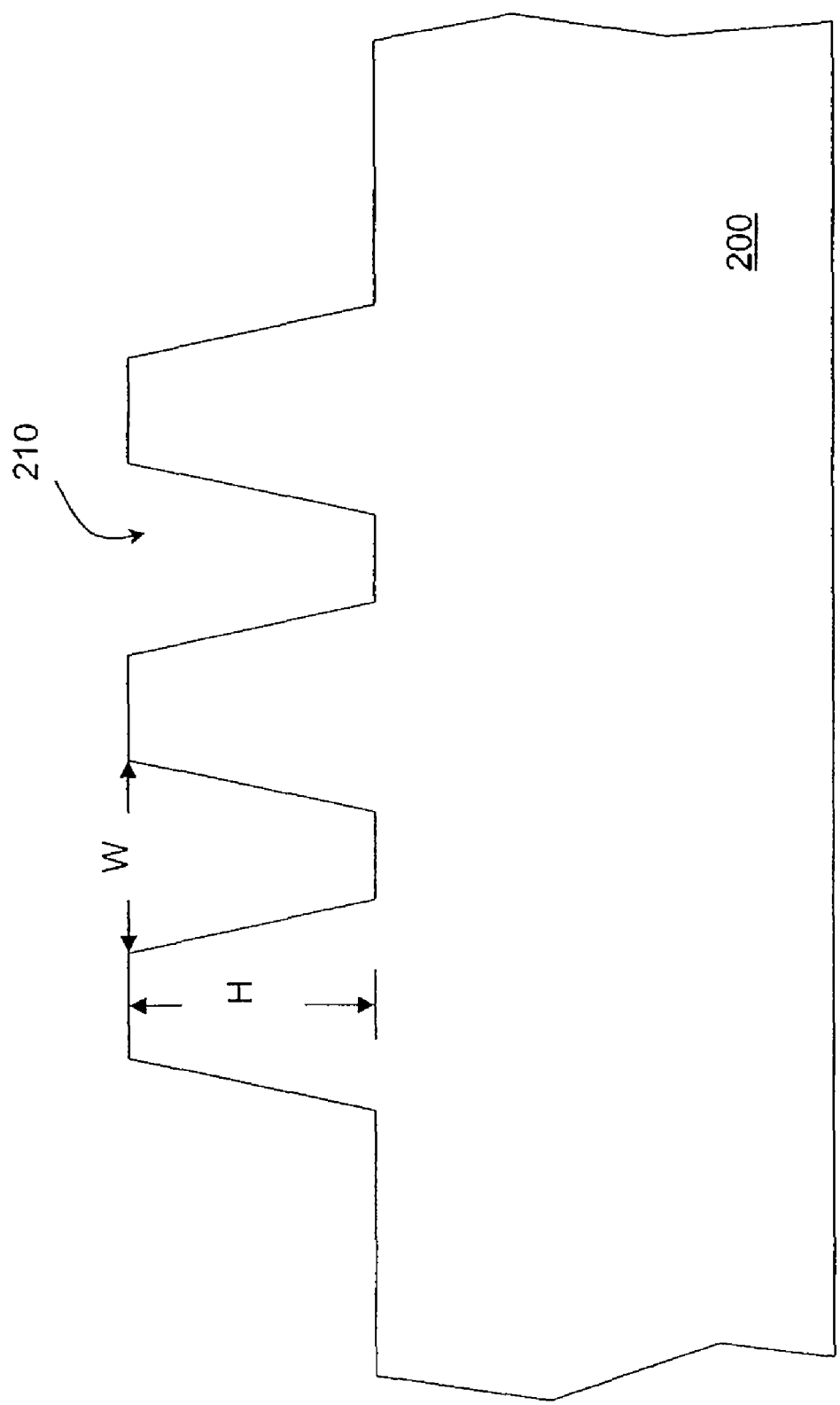
FIGS. 2A-2D are schematic cross-sectional views showing an exemplary method for forming a silicon oxide layer over a substrate.

FIG. 1 shows a flowchart that includes steps in an exemplary method 100 of forming an oxide layers over a substrate. The method 100 can include providing a substrate 200 to a deposition chamber in step 102. The substrate 200 may be a silicon substrate, a III-V compound substrate, a silicon/germanium (SiGe) substrate, an epi-substrate, a silicon-on-insulator (SOI) substrate, a display substrate such as a liquid crystal display (LCD), a plasma display, an electro luminescence (EL) lamp display, or a light emitting diode (LED) substrate, for example. In some embodiments, the substrate 200 may include at least one structure, such as trench structure, well, junction, diode, transistor, metal-oxide-semiconductor field effect transistor (MOSFET), interlayer dielectric (ILD) structure, inter-metal dielectric (IMD) structure, circuit, other semiconductor structure or various combinations thereof. The substrate 200 may be a semiconductor wafer (e.g., a 200 mm, 300 mm, 400 mm, etc. silicon wafer). In some embodiments, the substrate 200 may have at least one trench such as trenches 210 formed therein as shown in FIG. 2A. In some embodiments, the substrate 200 may be a semiconductor wafer (e.g., a 200 mm, 300 mm, 400 mm, etc. silicon wafer) and may include structures, device components, etc., formed in earlier processes. For example, the substrate may include the trenches 210 with high height to width aspect ratios (e.g., an aspect ratio of 5:1 or more, 6:1 or more, 7:1 or more, 8:1 or more, 9:1 or more, 10:1 or more, 11:1 or more, 12:1 more, etc.).

In some embodiments, the method 100 may include the remote generation of an atomic oxygen precursor at a location outside the deposition chamber in step 104. The atomic oxygen precursor may be generated by the dissociation of an oxygen containing precursor such as molecular oxygen ($O_2$), ozone ($O_3$), an nitrogen-oxygen compound (e.g., NO, $NO_2$, $N_2O$, etc.), a hydrogen-oxygen compound (e.g., $H_2O$, $H_2O_{02}$, etc.), a carbon-oxygen compound (e.g., CO, $CO_2$, etc.), as well as other oxygen containing precursors and combinations of precursors.

In some embodiments, the atomic oxygen precursor may be generated by the dissociation of an ozone-containing precursor. The ozone-containing precursor may be a mixture gas of oxygen and ozone. For example, oxygen can be provided into an ozone generator. Within the ozone generator, at least a portion of oxygen can be ozonized as ozone. In some embodiments, the oxygen may have a flow rate between about 3 standard liters per minute (slm) and about 20 slm. After the ozonization, ozone within oxygen may have a weight percentage between about 6% and about 20%.

In some embodiments, the dissociation of the oxygen containing precursor to generate the atomic oxygen may be done by thermal dissociation, ultraviolet light dissociation, and/or plasma dissociation, among other methods. Plasma dissociation may involve striking a plasma from helium, argon, etc., in a remote plasma generating chamber and introducing the oxygen precursor to the plasma to generate the atomic oxygen precursor.

Figure 2B:
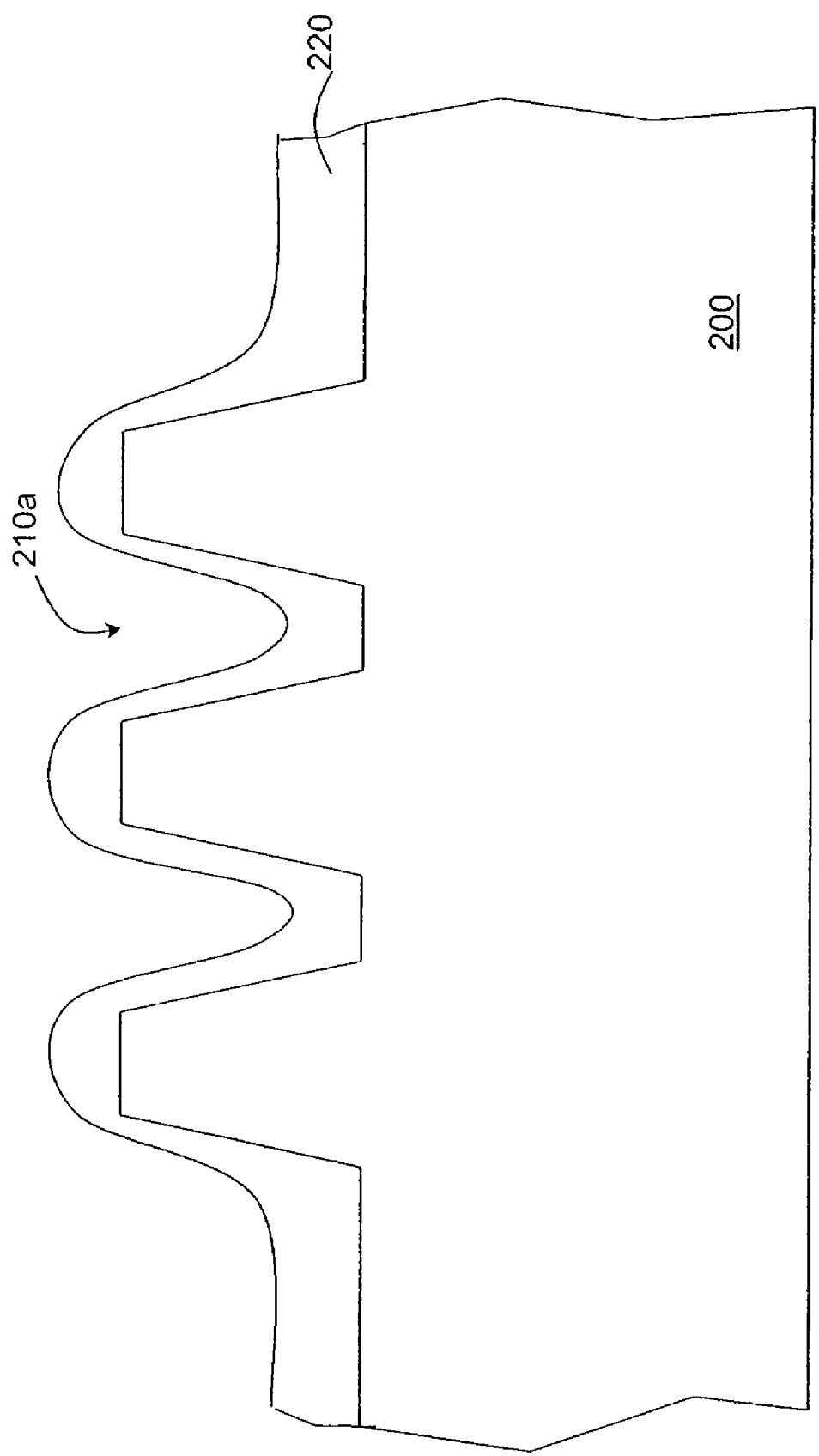
Figure 2C:
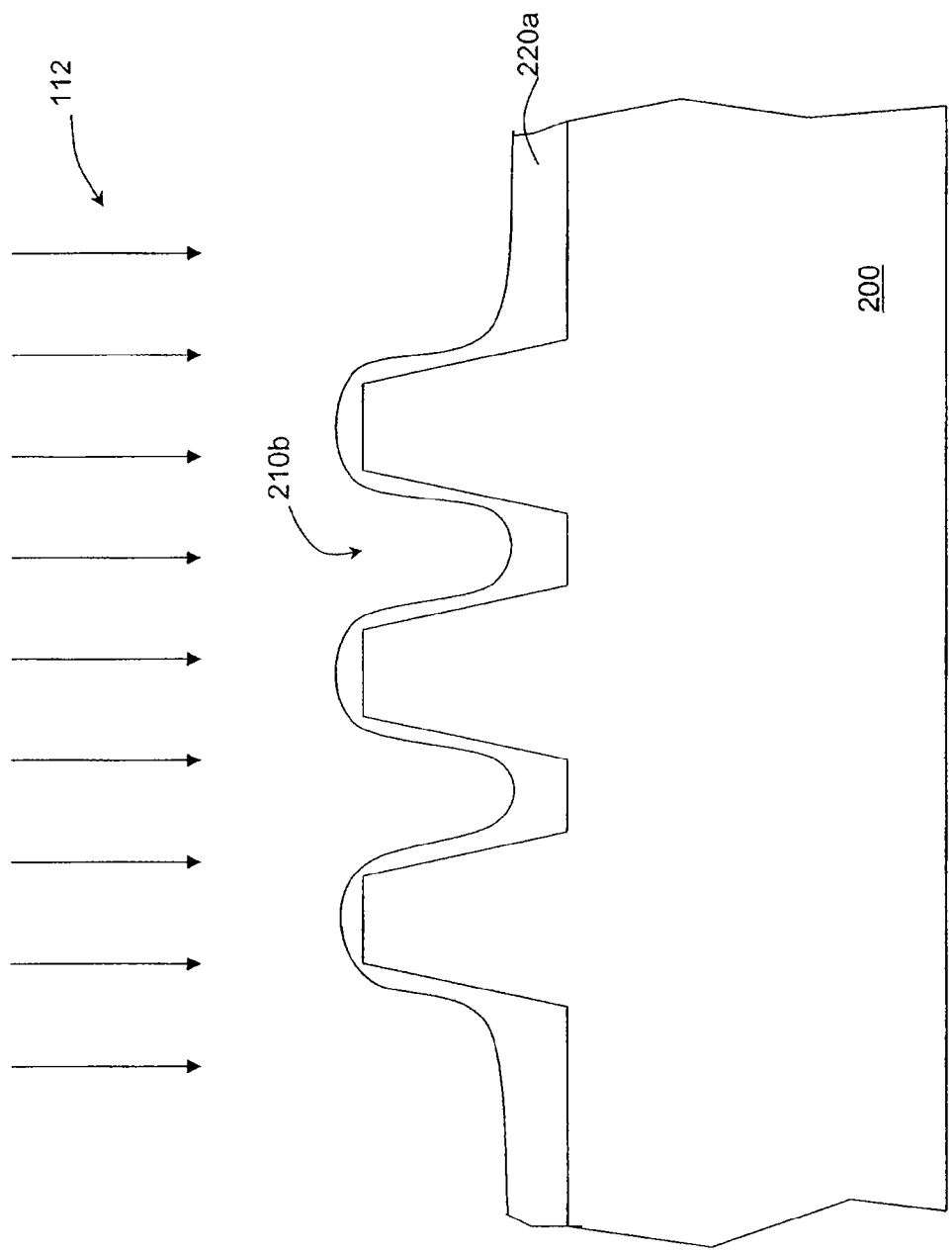

The atomic oxygen precursor can be introduced to the deposition chamber in step 106 where it may mix for the first time with a silicon precursor, which can be introduced to the chamber in step 108. The atomic oxygen precursor can react with the silicon precursor (and other deposition precursors that may be present in the reaction chamber) at a temperature between about −10° C. and about 200° C. and a pressure between about 10 Torr and about 760 Torr total chamber pressure to form a silicon oxide film 220 (shown in FIG. 2B) in step 110. The silicon oxide film 220 can reduce the aspect ratio of the trenches 210 to that of trenches 210a.

The silicon precursor may have a C:Si atom ratio of about 8 or less (e.g., a C:Si ratio of 7, 6, 5, 4, 3, 2, 1 or less). This means there can be fewer than 8 carbon atoms in the silicon precursor molecule for every silicon atom present.

In some embodiments, the silicon precursor may be a siloxane compound such as triethoxysiloxane (TRIES), tetramethoxysiloxane (TMOS), trimethoxysiloxane (TRIMOS), hexamethoxydisiloxane (HMODS), octamethoxytrisiloxane (OMOTS), and/or octamethoxydodecasiloxane (OMODDS), among other siloxane compounds:

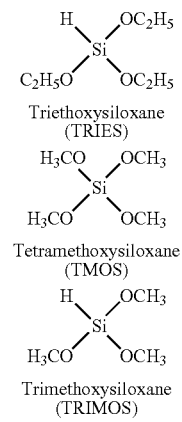

-continued

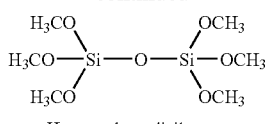
Hexamethoxydisiloxane
(HMODS)

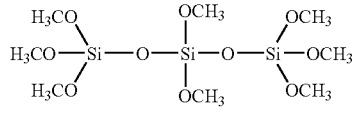
Octamethoxytrisiloxane
(OMOTS)

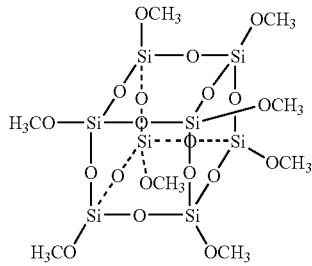
Octamethoxydodecasiloxane
(OMODDS)

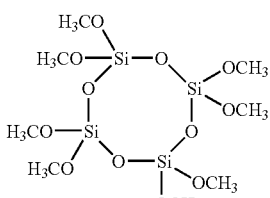
Octamethoxycyclicsiloxane

In other embodiments, the silicon precursor may also be a silazoxane compound that includes one or more nitrogen groups. The silazoxane compounds may include hexamethoxydisilazoxane (HMDS-H), methyl hexamethoxydisilazoxane (HMDS-CH$_3$), chlorohexamethoxydisilazoxane (HMDS-Cl), hexaethoxydislazoxane (HEDS-H), nonamethoxytrisilazoxane (NMTS), and octamethoxycyclicsilazoxane (OMCS), among other silazoxane compounds:

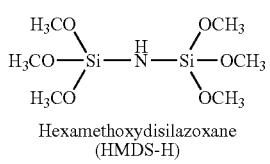
Hexamethoxydisilazoxane
(HMDS-H)

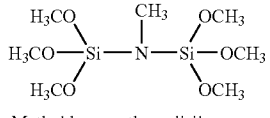
Methyl hexamethoxydisilazoxane
(HMDS-CH$_3$)

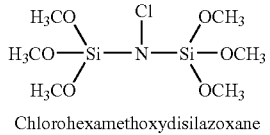
Chlorohexamethoxydisilazoxane
(HMDS-Cl)

-continued

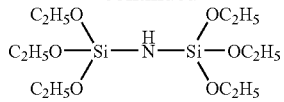
Hexamethoxydisilazoxane
(HEDS-H)

In still other embodiments, the silicon precursor may be a halogenated siloxane compound that includes one or more halogen groups (e.g., fluoride, chloride, bromide, or iodide groups). For example, the halogenated siloxane may be a chlorinated siloxane compound such as tetrachlorosilane (TECS), dichlorodiethoxysiloxane (DCDES), chlorotriethoxysiloxane (CTES), hexachlorodisiloxane (HCDS), and/or octachlorotrisiloxane (OCTS), among other chlorinated siloxane compounds:

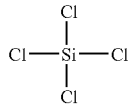
Tetrachlorosilane
(TECS)

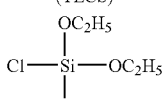
Dichlorodiethoxysiloxane
(DCDES)

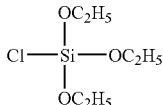
Chlorotriethoxysiloxane
(CTES)

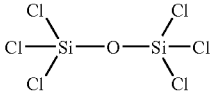
Hexachlorodisiloxane
(HCDS)

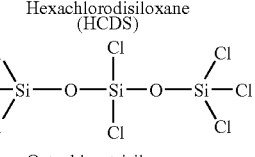
Octachlorotrisiloxane
(OCTS)

The silicon precursor may have an O:Si ratio of about 0, 0.5, 1, 2, 3, 4, 5, 6, etc., or more. For example, TMOS has an O:Si atom ratio of about 4. Other silicon precursors, such as TRIES, and TRIMOS, have an O:Si ratio of about 3. Still others, such as HCDS have an O:Si ratio of 0.5, and TECS has an O:Si ratio of 0.

The silicon precursors may include an Si—O—Si linkage, as seen in HMODS, OMOTS, OMODDS, HCDS, and OCTS, among other organo-silicon compounds. This linkage in the silicon precursor may facilitate the formation of SiO$_x$ films with reduced contamination from carbon and hydroxyl groups.

In some embodiments, the silicon precursors may include aminosilanes such as Trisilylamine (TSA), Hexamethyldisilazane (HMDS), Silatrane, Tetrakis(dimethylamino)silane, Bis(diethylamino)silane, Bis-tert-butylaminosilane; Bis-dimethylaminosilane (BDMAS), Tris(dimethylamino)chlorosilane, and methylsilatrane, among other compounds:

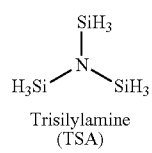
Trisilylamine
(TSA)

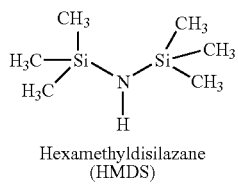
Hexamethyldisilazane
(HMDS)

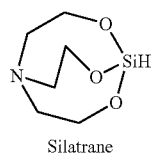
Silatrane

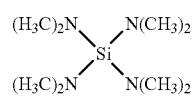
Tetrakis(dimethylamino)silane

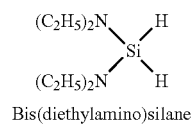
Bis(diethylamino)silane

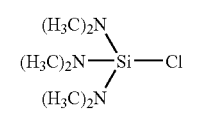
Tris(dimethylamino)chlorosilane

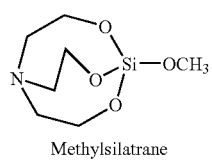
Methylsilatrane

In other embodiments, the silicon precursors may include disilanes including, alkoxy disilanes, alkoxy-alkyl disilanes, and alkoxy-acetoxy disilanes. The alkoxy disilanes may include:

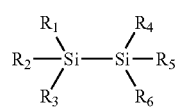

wherein $R_{1-6}$ may be, independently, a $C_{1-3}$ alkyloxy group. For example, the alkoxy disilanes may include hexamethoxydisilane, and hexaethoxydisilane among other alkoxy disilanes.

The alkoxy disilanes may include cyclic disilane compounds with alkoxy groups bonded to the Si moieties. For example, the alkoxycyclosilanes may include octaethoxycyclobutasilane, decabutaoxycyclopentasilane, and dodecamethoxycyclohexasilane, among others. Some examples of alkoxy disilanes are shown below:

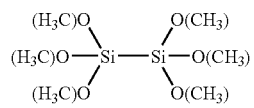
Hexamethoxydisilane

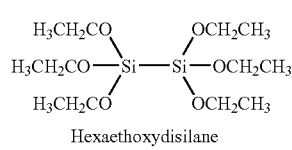
Hexaethoxydisilane

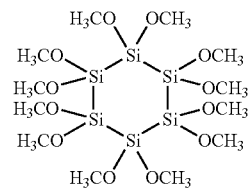
Dodecamethoxycyclohexasilane

The alkoxy-alkyl disilanes may include:

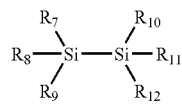

wherein $R_{7-12}$ may be, independently, a $C_{1-3}$ alkyl group or a $C_{1-3}$ alkyloxy group, and wherein at least one of $R_{7-12}$ is a alkyl group and at least one of $R_{7-12}$ is an alkyloxy group. Alkoxy-alkyl disilanes may also include cyclic disilanes with alkyl and alkoxy moieties, such as butasilanes, pentasilanes, hexasilanes, heptasilane, octasilanes, etc., having at least one alkyl and alkoxy group bonded thereto. Examples include octamethyl-1,4-dioxa-2,3,5,6-tetrasilacyclohexane; 1,4-dioxa-2,3,5,6-tetrasilacyclohexane; and 1,2,3,4,5,6-hexamethoxy-1,2,3,4,5,6,-hexamethylcyclohexasilane, among other alkoxy-alkyl cyclosilanes. Some examples of alkoxy-alkyl disilanes are shown below:

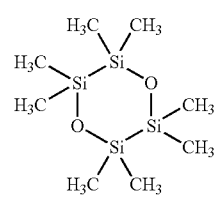
octamethyl-1,4-dioxa-2,3,5,6-tetrasilacyclohexane

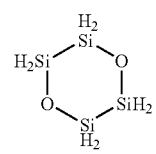
1,4-dioxa-2,3,5,6-tetrasilacyclohexane

-continued

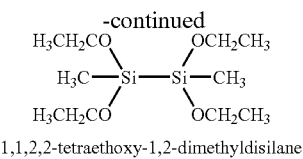

1,1,2,2-tetraethoxy-1,2-dimethyldisilane

Alkoxy-acetoxy disilanes may include:

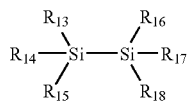

wherein $R_{13-17}$ may be, independently, a $C_{1-3}$ alkyl group, a $C_{1-3}$ alkoxy group, or an acetoxy group, and wherein at least one of $R_{13-17}$ is a alkoxy group and at least one of $R_{13-17}$ is an acetoxy group.

In still other embodiments, the silicon precursors may include organocyclosilanes such as cyclobutasilane, cyclopentasilane, cyclohexasilane, cycloheptasilane, cyclooctasilane, etc.

In some embodiments, the silicon precursor may be mixed with a carrier gas before or during its introduction to the deposition chamber. A carrier gas may be an inactive gas that does not substantially interfere with the formation of the oxide film 210 over the substrate 200. Examples of carrier gases can include helium, neon, argon, and hydrogen ($H_2$), among other gases.

In embodiments of method 100, the atomic oxygen precursors and silicon precursors may not be mixed before being introduced to the deposition chamber. The precursors may enter the chamber through separate spatially separated precursor inlets distributed around reaction chamber. For example, the atomic oxygen precursor may enter from an inlet (or inlets) at the top of the chamber and positioned directly above the substrate. The inlet may direct the flow of the oxygen precursor in a direction substantially perpendicular to the substrate deposition surface. Meanwhile, the silicon precursor may enter from one or more inlets around the sides of the deposition chamber. The inlets may direct the flow of the silicon precursor in a direction approximately parallel to the deposition surface.

In some embodiments, the atomic oxygen precursors and silicon precursors can be sent through separate ports of a multi-port showerhead. For example, a showerhead positioned above the substrate may include a pattern of openings for the precursors to enter the deposition chamber. One subset of openings may be supplied by the atomic oxygen precursor, while a second subset of openings is supplied by the silicon precursor. Precursors traveling through different sets of opening may be fluidly isolated from each other until exiting into the deposition chamber. Additional details about types and designs of precursor handling equipment is described in a co-assigned U.S. Provisional Patent App. No. 60/803,499 to Lubomirsky et al, filed May 30, 2006, and titled "PROCESS CHAMBER FOR DIELECTRIC GAPFILL," the entire contents of which are hereby incorporated by reference for all purposes.

As the atomic oxygen precursors and silicon precursors may react in the deposition chamber, they can form the silicon oxide layer 210 over the substrate deposition surface in step 110. The initial oxide layer may have desired flowability, and can desirably migrate into gaps, trenches, voids, seams, etc., in the structures present at the deposition surface. This can allow the method 100 to provide oxide fills that can be substantially free of voids and seams in gaps, trenches, and other surface structures that have high height to width aspect ratios (e.g., ARs of about 5:1, 6:1, 6:1, 8:1, 9:1, 10:1, 11:1, and 12:1 or more).

Referring again to FIG. 1, a post deposition anneal 112 of the deposited silicon oxide layer 210 (shown in FIG. 2B) may be done in a single step, or multiple steps. A single step anneal may be done, for example, by heating the deposited layer to about 300° C. to about 1000° C. (e.g., about 600° C. to about 900° C.) in a substantially dry atmosphere (e.g., dry nitrogen, helium, argon, etc.). The anneal can remove moisture from the deposited layer and converts Si—OH groups into silicon oxide. The annealed silicon oxide layer may have improved film quality (e.g., a WERR of about 6 to about 3, or less) and improved qualities as a dielectric (e.g., a k-value approaching or equal to pure silicon dioxide). In some embodiments, the anneal step 112 may be carried out at about 900° C. in a nitrogen ambient for about one hour.

In some embodiments, multi-step anneals may include a two-step anneal where the layer first can undergo a wet anneal stage, such as heating the layer to, for example, about 650° C. in the presence of steam. This may be followed by a dry anneal stage, where the layer can be heated to a higher temperature (e.g., about 900° C.) in an atmosphere that is substantially free of moisture (e.g., dry $N_2$).

In addition to wet and dry thermal annealing, other annealing techniques (alone or in combination) may be used to anneal the silicon oxide layer 114. These include a steam anneal, a thermal anneal, an inductively coupled plasma (ICP) anneal, an ultraviolet light anneal, an e-beam anneal, an acid vapor catalysis anneal, a base vapor catalysis anneal and/or a microwave anneal, among others.

Figure 2D:
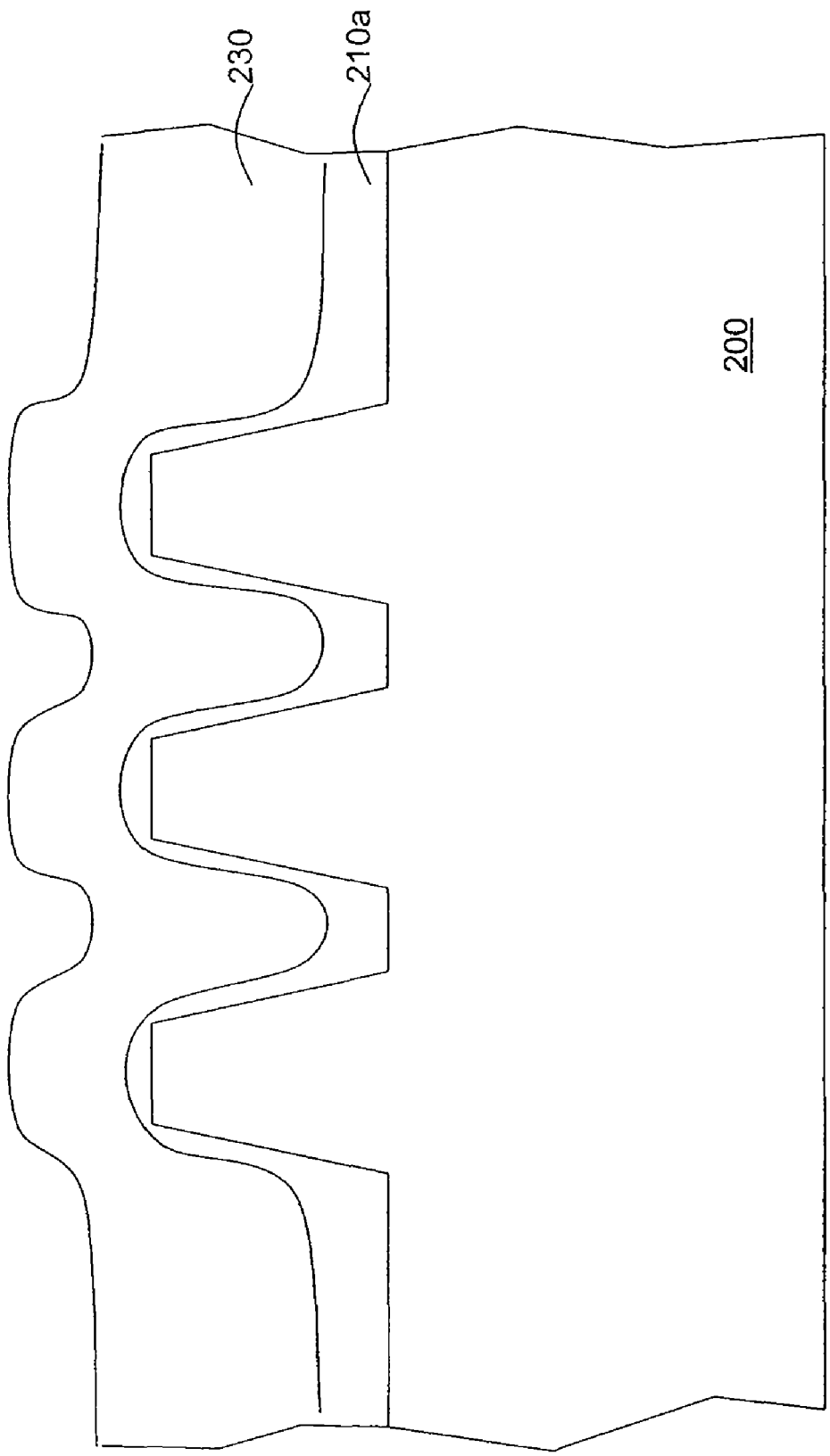

FIG. 2D is a cross-sectional view showing an exemplary STI structure. In FIG. 2D, a dielectric layer 230 such as a high density plasma chemical vapor deposition (HDP CVD) layer may be formed over the annealed silicon oxide layer 220a. Since the annealed silicon oxide layer 220a can have a thickness at the bottom region of the trenches 210 larger than that on the sidewalls of the trenches 210, the aspect ratio of the trenches 210a may be desirably reduced. Accordingly, the dielectric layer 230 may be formed and filled within the trenches 210a without substantially forming seams, gaps or voids within the dielectric layer 230. In some embodiments, the formation of the dielectric layer 230 can be optional if the oxide layer 220 may desirably fill the trenches 210 shown in FIG. 2A.

In some embodiments, the dielectric layer 230 may be subjected to a thermal treatment such as an anneal process (not shown). The thermal treatment may desirably densify the dielectric layer 230. In some embodiments, the processes for forming the dielectric layer 230 and the thermal treatment may be optional. The silicon oxide layer 220 (shown in FIG. 2B) may be formed and substantially fill the trenches 210.

Another Exemplary Oxide Layer Formation Processes

Figure 3:
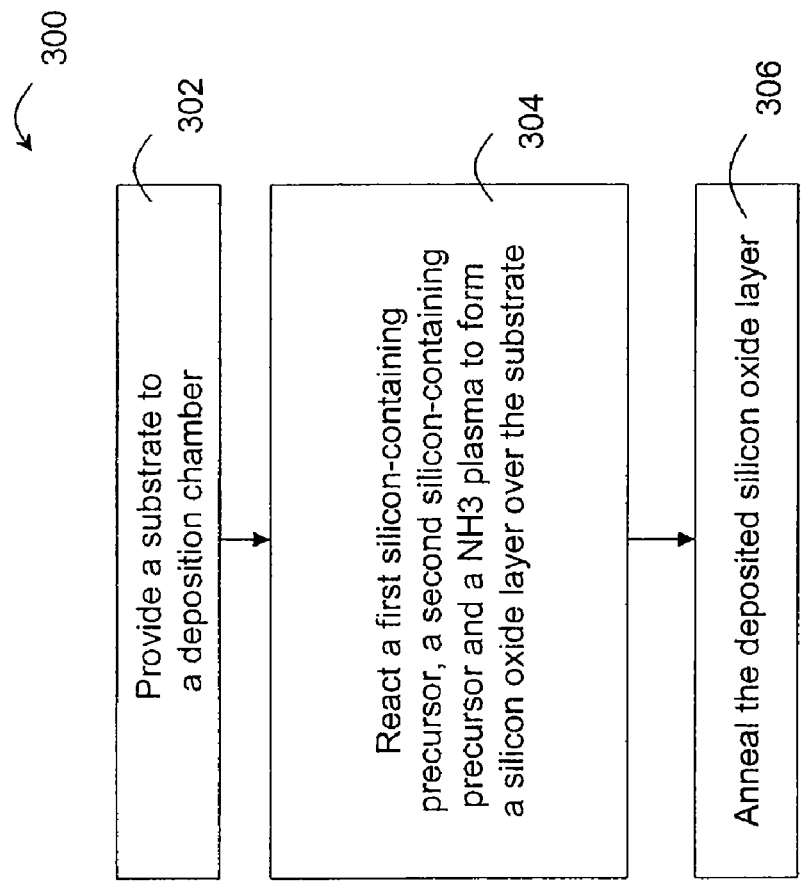
FIG. 3 is a flow chart showing another exemplary embodiment for forming a silicon oxide layer.

FIG. 3 is a flow chart showing another exemplary method for forming an silicon oxide layer. Referring to FIG. 3, the method 300 for forming an silicon oxide layer may include steps 302, 304 and 306. Step 302 can provide a substrate (not shown) into a deposition chamber. The substrate may be similar to the substrate 200 described above in conjunction with FIG. 1.

In step 304, a first silicon-containing precursor, a second silicon-containing precursor and an ammonia ($NH_3$) plasma can be reacted to form a silicon oxide layer. In some embodiments, the first silicon-containing precursor can include at least one of Si—H bond and Si—Si bond. In other embodiments, the first-silicon-containing precursor can be reactive with NH$_3$ plasma. In still other embodiments, the first silicon-containing precursor may include at least one of TMDSO, trimethosysiloxane (TRIMOS), hexachlorodisiloxane (HCDS), DMTMDS, SAM24, TMCTS and BTBAS. In some embodiments, the first silicon-containing precursor may have a C:Si atom ratio of about 8 or less.

In some embodiments, the second silicon-containing precursor may include at least one Si—N bond. The second silicon-containing precursor may desirably reduce shrinkage of the silicon oxide layer. In some embodiments, the second silicon-containing precursor may expand the atomic structure of the silicon oxide layer. For example, the shrinkage of the silicon oxide layer can be of about 32% or less. In some embodiments, the second silicon-containing precursor may expand the silicon oxide layer by 11% or less.

In some embodiments, the second-containing precursor may include TSA. In some embodiments, at least one of Si—H bonds of TSA can be replaced by Si—CH$_3$ bond. For example, a Si—H bond on each of SiH$_3$ can be replaced by a Si—CH$_3$ bond.

It is noted that the NH$_3$ plasma may be generated in an external plasma generator or in the deposition chamber. The first silicon-containing precursor and the second silicon-containing precursor may be mixed or separately introduced into the deposition chamber to interact with the NH$_3$ plasma.

In some embodiments using TMDSO and TSA, step 304 may have a processing temperature between about 0° C. or more. In some embodiments, the processing temperature is between about 10° C. and about 25° C. The flow rate of TSA can be between about 10 standard centimeter per minute (sccm) and about 550 sccm. In some embodiments, the flow rate of TSA can be between about 400 sccm and about 430 sccm. The flow rate of TMDSO can be between about 10 milligrams per minute (mgm) and about 1500 mgm. In some embodiments, the flow rate of TMDSO is about 1000 mgm. In some embodiments, the precursor for generating the NH$_3$ plasma can have a flow rate between about 1000 sccm and about 1,250 sccm. In some embodiments, the flow rate of NH$_3$ is between about 1,000 sccm and about 1,250 sccm.

Referring again to FIG. 3, step 306 can cure the deposited silicon oxide layer. In some embodiments, step 306 may be similar to step 112 described above in conjunction with FIG. 1.

In some embodiments for forming a silicon oxide layer, the flow rate of TSA can be about 400 sccm. The flow rate of TMDSO can be about 1,000 mgm. The flow rate of the precursor for generating the NH$_3$ plasma can be about 1,250 sccm. The processing temperature can be about 10° C. The processing pressure can be about 1.5 Torr. In some embodiments, the curing step 306 may be omitted. An anneal process (not shown) may be applied to the deposited silicon oxide layer, the anneal process may be a two-step steam anneal. One of the steps may have a processing temperature of about 600° C.; the other of the steps may have a processing temperature of about 850° C.

Exemplary Substrate Processing System

Deposition systems that may implement embodiments of the present invention may include high-density plasma chemical vapor deposition (HDP-CVD) systems, plasma enhanced chemical vapor deposition (PECVD) systems, sub-atmospheric chemical vapor deposition (SACVD) systems, and thermal chemical vapor deposition systems, among other types of systems. Specific examples of CVD systems that may implement embodiments of the invention include the CENTURA ULTIMA™ HDP-CVD chambers/systems, and PRODUCER™ PECVD chambers/systems, available from Applied Materials, Inc. of Santa Clara, Calif.

Examples of substrate processing systems that can be used with exemplary methods of the invention may include those shown and described in co-assigned U.S. Provisional Patent App. No. 60/803,499 to Lubomirsky et al, filed May 30, 2006, and titled "PROCESS CHAMBER FOR DIELECTRIC GAPFILL," the entire contents of which is herein incorporated by reference for all purposes. Additional exemplary systems may include those shown and described in U.S. Pat. Nos. 6,387,207 and 6,830,624, which are also incorporated herein by reference for all purposes.

Figure 4A:
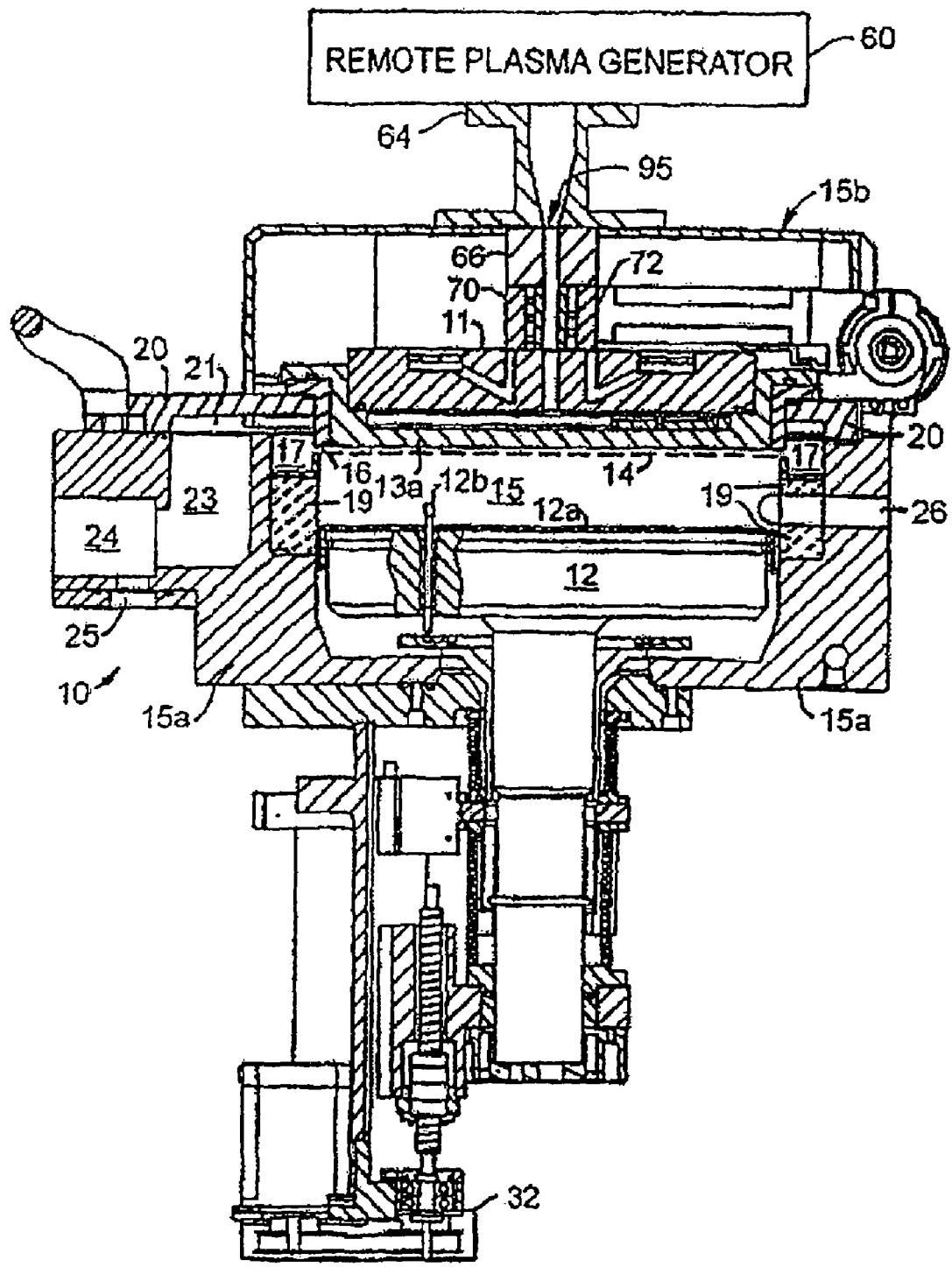
FIG. 4A shows a vertical cross-sectional view of an exemplary thin film deposition system.

Referring now to FIG. 4A, vertical cross-sectional views of a CVD system 10 is shown that has a vacuum or processing chamber 15 that includes a chamber wall 15a and a chamber lid assembly 15b. The CVD system 10 contains a gas distribution manifold 11 for dispersing process gases to a substrate (not shown) that rests on a heated pedestal 12 centered within the process chamber 15. Gas distribution manifold 11 may be formed from an electrically conducting material in order to serve as an electrode for forming a capacitive plasma. During processing, the substrate (e.g. a semiconductor wafer) is positioned on a flat (or slightly convex) surface 12a of the pedestal 12. The pedestal 12 can be moved controllably between a lower loading/off-loading position (depicted in FIG. 4A) and an upper processing position (indicated by dashed line 14 in FIG. 4A), which is closely adjacent to the manifold 11. A centerboard (not shown) includes sensors for providing information on the position of the wafers.

Deposition and carrier gases are introduced into the chamber 15 through perforated holes 13b of a conventional flat, circular gas distribution faceplate 13a. More specifically, deposition process gases flow into the chamber through the inlet manifold 11, through a conventional perforated blocker plate 42 and then through holes 13b in gas distribution faceplate 13a.

Before reaching the manifold 11, deposition and carrier gases are input from gas sources 7 through gas supply lines 8 into a mixing system 9 where they are combined and then sent to manifold 11. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in the CVD system 10 can be either a thermal process or a plasma-enhanced process. In a plasma-enhanced process, an RF power supply 44 applies electrical power between the gas distribution faceplate 13a and the pedestal 12 so as to excite the process gas mixture to form a plasma within the cylindrical region between the faceplate 13a and the pedestal 12. (This region will be referred to herein as the "reaction region"?). Constituents of the plasma react to deposit a desired film on the surface of the semiconductor wafer supported on pedestal 12. RF power supply 44 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15. In a thermal process, the RF power supply 44 would not be utilized, and the process gas mixture thermally reacts to deposit the desired films on the surface of the semiconductor wafer supported on the pedestal 12, which is resistively heated to provide thermal energy for the reaction.

During a plasma-enhanced deposition process, the plasma heats the entire process chamber 10, including the walls of the chamber body 15a surrounding the exhaust passageway 23 and the shut-off valve 24. When the plasma is not turned on or during a thermal deposition process, a hot liquid is circulated through the walls 15a of the process chamber 15 to maintain the chamber at an elevated temperature. The passages in the remainder of the chamber walls 15a are not shown. Fluids used to heat the chamber walls 15a include the typical fluid types, i.e., water-based ethylene glycol or oil-based thermal transfer fluids. This heating (referred to as heating by the "heat exchanger") beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction byproducts, is evacuated from the chamber 15 by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360.degree. circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of the pedestal 12 (preferably aluminum, ceramic, or a combination thereof) is resistively heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as aluminum, anodized aluminum, or ceramic. An example of such a CVD apparatus is described in co-assigned U.S. Pat. No. 5,558,717 entitled "CVD Processing Chamber," issued to Zhao et al, and hereby incorporated by reference in its entirety.

A lift mechanism and motor 32 (FIG. 4A) raises and lowers the heater pedestal assembly 12 and its wafer lift pins 12b as wafers are transferred into and out of the body of the chamber 15 by a robot blade (not shown) through an insertion/removal opening 26 in the side of the chamber 10. The motor 32 raises and lowers pedestal 12 between a processing position 14 and a lower, wafer-loading position. The motor, valves or flow controllers connected to the supply lines 8, gas delivery system, throttle valve, RF power supply 44, and chamber and substrate heating systems are all controlled by a system controller over control lines 36, of which only some are shown. Controller 34 relies on feedback from optical sensors to determine the position of movable mechanical assemblies such as the throttle valve and susceptor which are moved by appropriate motors under the control of controller 34.

In the exemplary embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, the memory 38 is a hard disk drive, but the memory 38 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 34.

A process for depositing a film on a substrate or a process for cleaning the chamber 15 can be implemented using a computer program product that is executed by the controller 34. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

Figure 4B:
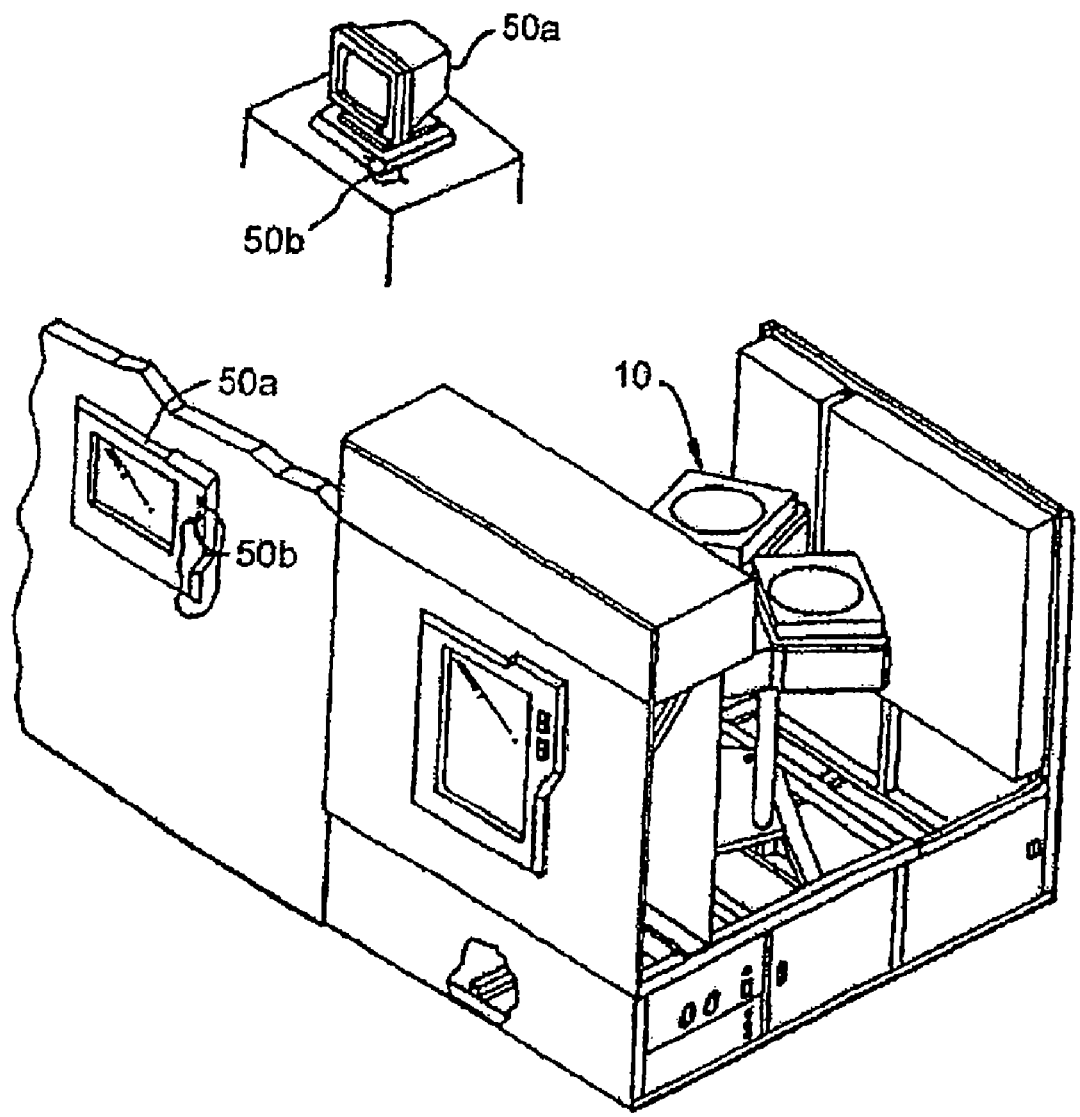
FIG. 4B is a simplified diagram of an exemplary system monitor/controller component of a thin film deposition system.

The interface between a user and the controller 34 is via a CRT monitor 50a and light pen 50b, shown in FIG. 4B, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 34.

FIG. 4A shows a remote plasma generator 60 mounted on the lid assembly 15b of the process chamber 15 including the gas distribution faceplate 13a and the gas distribution manifold 11. A mounting adaptor 64 mounts the remote plasma generator 60 on the lid assembly 15b, as best seen in FIG. 4A. The adaptor 64 is typically made of metal. A mixing device 70 is coupled to the upstream side of the gas distribution manifold 11 (FIG. 4A). The mixing device 70 includes a mixing insert 72 disposed inside a slot 74 of a mixing block for mixing process gases. A ceramic isolator 66 is placed between the mounting adaptor 64 and the mixing device 70 (FIG. 6A). The ceramic isolator 66 may be made of a ceramic material such as $Al_2O_3$ (99% purity), Teflon®, or the like. When installed, the mixing device 70 and ceramic isolator 66 may form part of the lid assembly 15b. The isolator 66 isolates the metal adaptor 64 from the mixing device 70 and gas distribution manifold 11 to minimize the potential for a secondary plasma to form in the lid assembly 15b as discussed in more detail below. A three-way valve 77 controls the flow of the process gases to the process chamber 15 either directly or through the remote plasma generator 60.

The remote plasma generator 60 is desirably a compact, self-contained unit that can be conveniently mounted on the lid assembly 15b and be easily retrofitted onto existing chambers without costly and time-consuming modifications. One suitable unit is the ASTRON® generator available from Applied Science and Technology, Inc. of Woburn, Mass. The ASTRON® generator utilizes a low-field toroidal plasma to dissociate a process gas. In one example, the plasma dissociates a process gas including a fluorine-containing gas such as $NF_3$ and a carrier gas such as argon to generate free fluorine which is used to clean film deposits in the process chamber 15.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a method" includes a plurality of such methods and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed:

1. A method of depositing a flowable silicon oxide layer on a substrate, the method comprising:
   providing the substrate to a deposition chamber;
   dissociating an ozone-containing precursor to form a mixture comprising atomic oxygen, wherein dissociating the ozone-containing precursor comprises introducing the ozone-containing precursor into a remote plasma generating chamber and striking a plasma in the remote plasma generating chamber;
   transferring the mixture comprising atomic oxygen from the remote plasma generating chamber into the deposition chamber;
   introducing a silicon-and-halogen-containing precursor to the deposition chamber, the silicon-and-halogen-containing precursor having a C:Si atom ratio of about 8 or less, the silicon-and-halogen-containing precursor and the mixture comprising atomic oxygen being first mixed in the deposition chamber;
   reacting the silicon-and-halogen-containing precursor and the mixture comprising atomic oxygen to form the flowable silicon oxide layer on the substrate; and
   annealing the flowable silicon oxide layer;
   wherein a molar ratio of the silicon-and-halogen-containing precursor to the mixture comprising atomic oxygen is between about 1:10 and about 100:1.

2. The method of claim 1, wherein the ozone-containing precursor comprises a mixture of ozone and oxygen, wherein the mixture of ozone and oxygen comprises between about 6% and about 20% ozone by weight.

3. The method of claim 2, wherein the ozone is generated from the oxygen.

4. The method of claim 3, wherein a flow rate of the oxygen is between about 3 standard liters per minute (slm) and about 20 slm.

5. The method of claim 1, wherein reacting the silicon precursor and the atomic oxygen precursor has a process pressure between about 100 Torr and about 760 Torr.

6. The method of claim 1, wherein reacting the silicon precursor and the atomic oxygen precursor has a process temperature between about −10° C. and about 200° C.

7. The method of claim 1, wherein the silicon precursor has an O:Si ratio of about 3 or more.

8. The method of claim 1, wherein the silicon precursor includes at least one of siloxane, silazoxane and halogenated siloxane.

9. The method of claim 8, wherein the siloxane is selected from the group consisting of triethoxysiloxane, tetramethoxysiloxane, trimethoxysiloxane, hexamethoxydisiloxane, octamethoxytrisiloxane, octamethosydodecasiloxane and octamethoxydodecasiloxane.

10. The method of claim 8, wherein the silazoxane is selected from the group consisting of hexamethoxydisilazoxane, methyl hexamethoxydisilazoxane, chlorohexamethoxydisilazoxane, hexaethoxydislazoxane, octamethoxycyclicsilazoxane, and nonamethoxytrisilazoxane.

11. The method of claim 8, wherein the halogenated siloxane is selected from the group consisting of dichlorodiethoxysiloxane, chlorotriethoxysiloxane, hexachlorodisiloxane, and octachlorotrisiloxane.

12. The method of claim 1, wherein the silicon precursor comprises an aminosilane, an alkyl disilane, an alkoxy disilane, an alkoxy-alkyl disilane, an alkoxy-acetoxy disilane, or a cyclosilane.

13. The method of claim 12, wherein the amionsilane is selected from the group consisting of trisilylamine (TSA), hexamethyldisilazane (HMDS), silatrane, tetrakis(dimethylamino)silane, bis(diethylamino)silane, bis-tert-butylaminosilane; bis-dimethylaminosilane (BDMAS), tris(dimethylamino)chlorosilane and methylsilatrane.

14. The method of claim 1, wherein annealing the deposited silicon oxide layer comprises at least one of a steam anneal, a thermal anneal, an inductively coupled plasma (ICP) anneal, an ultraviolet light anneal, an e-beam anneal, an acid vapor catalysis anneal, a base vapor catalysis anneal and a microwave anneal.

15. The method of claim 1, wherein the silicon-and-halogen-cotaining precursor includes tetrachlorosilane.

16. A method of depositing a flowable silicon oxide layer on a substrate, the method comprising:
providing a substrate to a deposition chamber;
dissociating a mixture of ozone and oxygen to form a mixture comprising atomic oxygen, wherein dissociating the mixture of ozone and oxygen comprises introducing the mixture into a remote plasma generating chamber and striking a plasma in the remote plasma generating chamber located outside the deposition chamber;
transferring the mixture comprising atomic oxygen from the remote plasma generating chamber into the deposition chamber;
introducing a silicon-and-halogen-containing precursor to the deposition chamber, the silicon precursor having a C:Si atom ratio of about 8 or less, the silicon-and-halogen-containing precursor and the mixture comprising atomic oxygen being first mixed in the deposition chamber;
reacting the silicon-and-halogen-containing precursor and the mixture comprising atomic oxygen at a process pressure between about 100 Torr and about 760 Torr to form the flowable silicon oxide layer on the substrate; and
annealing the flowable silicon oxide layer.

17. The method of claim 16, wherein the mixture of ozone and oxygen comprises between about 6% and about 20% ozone by weight.

18. The method of claim 17, wherein a flow rate of the oxygen is between about 3 standard liters per minute (slm) and about 20 slm.

19. The method of claim 16, wherein a molar ratio of the silicon-and-halogen-containing precursor to the mixture comprising atomic oxygen is between about 1:10 and about 100:1.

20. The method of claim 16, wherein reacting the silicon-and-halogen-containing precursor and the mixture comprising atomic oxygen has a process temperature between about −10° C. and about 200° C.

21. The method of claim 16, wherein the silicon-and-halogen-containing precursor includes at least one of a halogenated silazoxane and a halogenated siloxane.

22. The method of claim 16, wherein the silicon-and-halogen-containing precursor comprises a chlorinated siloxane.

23. The method of claim 16, wherein the silicon-and-halogen-containing precursor comprises a halogenated siloxane selected from the group consisting of tetrachlorosiloxane, dichlorodiethoxysiloxane, chlorotriethoxysiloxane, hexachlorodisiloxane, and octachlorotrisiloxane.

24. The method of claim 16, wherein the silicon-and-halogen-containing precursor comprises an aminosilane, an alkyl disilane, an alkoxy disilane, an alkoxy-alkyl disilane, an alkoxy-acetoxy disilane, or a cyclosilane.

25. The method of claim 24, wherein the aminosilane is selected from the group consisting of trisilylamine (TSA), hexamethyldisilazane (HMDS), silatrane, tetrakis(dimethylamino)silane, bis(diethylamino)silane, bis-tert-butylaminosilane; bis-dimethylaminosilane (BDMAS), tris(dimethylamino)chlorosilane and methylsilatrane.

26. The method of claim 16, wherein annealing the flowable silicon oxide layer comprises at least one of a steam anneal, a thermal anneal, an inductively coupled plasma (ICP) anneal, an ultraviolet light anneal, an e-beam anneal, an acid vapor catalysis anneal, a base vapor catalysis anneal and a microwave anneal.

* * * * *